STANDARDIZED HIGH-DENSITY INTEGRATED CIRCUIT ARRANGEMENT AND METHOD

Filed March 23, 1967 2 Sheets-Sheet 1

INVENTOR
ARNOLD WEINBERGER

BY S. P. Tedesco

ATTORNEY

Oct. 28, 1969 A. WEINBERGER 3,475,621

STANDARDIZED HIGH-DENSITY INTEGRATED CIRCUIT ARRANGEMENT AND METHOD

Filed March 23, 1967 2 Sheets-Sheet 2

United States Patent Office 3,475,621

Patented Oct. 28, 1969

3,475,621
STANDARDIZED HIGH-DENSITY INTEGRATED CIRCUIT ARRANGEMENT AND METHOD

Arnold Weinberger, Newburgh, N.Y., assignor to International Business Machines Corporation, Armonk, N.Y., a corporation of New York Filed Mar. 23, 1967, Ser. No. 625,394
Int. Cl. H03k *19/34*
U.S. Cl. 307—215 25 Claims

ABSTRACT OF THE DISCLOSURE

A plurality of spaced parallel elongated diffusions of first conductivity type are formed as a basic pattern on a semiconductor wafer surface of opposite conductivity type, each pair of adjacent diffusions defining one ground and one output diffusion of one or more insulated-gate field effect transistors acting as input devices of a logical element. The ground diffusions are extensions of a common ground diffusion and each of the output diffusions is connected along an individual load device to a common power supply diffusion. "Personality" for generating a particular logical function is assigned by a single-level metallization pattern formed over an insulating layer which defines the gate electrodes of input devices to the logical elements and, also, signal nets interconnecting the output diffusions of selected logical elements to input devices of other logical elements. The input devices are distributed along the input channels of corresponding logical elements such that signal nets can pass therebetween and are confined over the semiconductor surface allotted to the basic diffusion pattern; only signal nets carrying inputs and outputs of the composite function generated by the logical elements need to be directed externally of the integrated arrangement of logical elements. In effect, the interconnection and active device areas of the integrated arrangement are overlapped such that the same area of the semiconductor surface can be utilized either to define an input device or for interconnection purposes. Such flexibility substantially improves packing density along with the attending reduction in wire length, circuit delay, etc., and readily adapts standard diffusion patterns to different circuit requirements.

BACKGROUND OF THE INVENTION

The present invention relates to high-density integrated circuit arrangements for generating complex logical functions that include combinational and sequential logic. By an integrated circuit arrangement is meant that the semiconductor wafer forms an essential constituent of the active circuit elements and, in addition, provides structural support therefor.

With the development of complex electronic equipments and the attending high manufacturing costs, industry is expending great effort to batch-fabricate large numbers of active circuit elements along with functional connections therebetween. Such efforts are directed to submicrominiaturization of active circuit elements so as to reduce unit cost and, also, to improve reliability and optimize power utilization from the system viewpoint. Submicrominiaturization is also dictated by the speed requirements of such systems, since the length of functional interconnections, or signal nets, between the active circuit elements can be substantially reduced. Industry is presently contemplating that complex arrays of such elements equivalent to many hundreds of logical elements will be formed on a semiconductor wafer of one-inch diameter.

Numerous problems are associated with the obtainment of these objectives, primary among which is the ability to interconnect logical elements of high-packing density to form complex logical functions coupled with the ability to translate rapidly logic specifications to complete subsystem functions. The inability to simultaneously achieve both of these objectives has resulted in a substantial sacrifice of packing density and/or design turn-around time, since considerable surface area of the semiconductor wafer must be allotted to the interconnection if any degree of standardization is included to improve turn-around time.

Present-day manufacturing techniques attempt to optimize packing density by providing a customized circuit design and layout wherein each of the logical elements and functional interconnections therebetween is located strategically on the semiconductor surface. A customized circuit design and layout requires great expenditure of time and resources, and is practical only when the integrated circuit arrangement includes a high degree of repetitiveness and flexibility of the interconnection arrangement is not required, e.g., memories, decoder arrangements, shift registers, etc. When a high degree of repetitiveness is not present and interconnection techniques must exhibit a high degree of flexibility to reduce manufacturing costs and provide an efficient way of translating logic specifications into subsystem functions, such techniques are not available. In such event, logical element standardization, e.g., using only NOR's, is employed to reduce engineering turn-around time and reduce development costs. For example, standardized logical elements are arranged in a coordinate array on the semiconductor surface, spacing therebetween being alloted for the interconnection pattern. In the present technology, large scale integration of logical elements may require that between 60% and 70% of the available semiconductor surface is allotted to the functional interconnection pattern. The interconnection pattern between standardized logical elements arranged in a coordinate array can be computer-generated to effect a flexible interconnection pattern among logical elements that pass proper circuit tests, or particular groupings of standardized logical elements which satisfy a particular mask set are selected and a fixed interconnection pattern is effected therebetween. When such latter techniques are employed, packing density is not optimized.

Accordingly, the present state of the art can be characterized in that the standardized logical elements are arranged in ordered fashion, and functional interconnections therebetween are effected in non-ordered fashion, for example, as described in U.S. Patent 3,312,871 issued Apr. 4, 1967 by H. Seki et al. entitled "Scheme for Interconnection in Integrated Circuitry" and commonly assigned. Such technique requires the allocation of a particular portion of the semiconductor surface for the functional interconnection pattern such that packing density is not optimized; moreover, the fabrication process was often complicated by the necessity of providing additional crossover-crossunder connections. Alternatively, when high repetitiveness of a subsystem function is present such that the arrangement of logical elements of the subsystem function and interconnections therebetween can be repeated, both logical elements and functional interconnections therebetween have been arranged in non-order fashion to increase packing density and minimize interconnection distance to effect a particular subsystem function. With respect to other subsystem functions, such technique, however, is totally void of standardization which has been recognized as the essential element for achieving rapid design turn-around time. The aforementioned objectives of industry, i.e., reducing design turn-around time and increasing packing density, can be better achieved if comparable packing densities can be obtained with standardization techniques.

Accordingly, it is an object of this invention to provide an integrated circuit arrangement having an optimum packing density.

Another object of this invention is to provide a novel method for effecting functional interconnections between logical elements formed in a one-dimensional array on a semiconductor surface.

Another object of this invention is to provide a highly flexible interconnection arrangement for logical elements formed on a semiconductor surface wherein high packing density is achieved while using standardization techniques.

Another object of this invention is to provide a highly flexible technique for interconnecting a plurality of logical elements, e.g., NOR's defined in a standardized one-dimensional array to perform a complex logical function.

Another object of this invention is to provide a novel interconnection arrangement for integrated circuits capable of performing complex logical functions wherein the need for crossunder-crossover connections is minimized.

Another object of this invention is to provide flexibility for special circuit requirements where standardization is achieved by a basic diffusion pattern of high-density.

SUMMARY OF THE INVENTION

These and other objects and features of this invention are obtained by defining the input channels of the logical elements, e.g., NOR's by a basic pattern of elongated diffusions on the semiconductor surface to achieve a standardized one-dimensional array and forming signal nets insulated from and passing over such basic diffusion pattern to interconnect such logical elements to achieve high-density. In other words, the circuit and interconnection areas are overlapped, i.e., a same surface area being utilized either to define an input device of a logical element or for interconnection purposes.

Adjacent diffusions in the basic pattern correspond to the ground and output diffusions of an individual NOR element, the number of such diffusions being determined by the number of NOR elements required to generate a particular complex logical function. The semiconductor surface between the adjacent ground and output diffusions defines the input channel of the NOR element, input devices to such NOR element being defined by gate metallization registered over such input channel. Gate metallizations are spaced along the corresponding input channel to allow for the passing of signal nets between output diffusions and input devices of other NOR elements defined by the basic diffusion pattern. The one-dimensional array of NOR elements is interconnected by a two step process. First, the insulating layer formed over the basic diffusion pattern is reduced in thickness where an input device to a NOR element is to be defined and, also, a pattern of access holes is etched through such layer to the output diffusions of the NOR elements. Secondly, a metallic pattern is formed over the insulating layer defining the gate metallizations of the input devices and the signal nets oriented, preferably, transverse to the basic diffusion pattern and interconnecting selected input devices to selected output diffusions of the NOR elements through the access holes. Since the signal nets are located over thicker portions of the insulating layer, "field effect" crosstalk along the input channels of the NOR elements is avoided. In accordance with more particular aspects of this invention, input devices to be connected along a same signal net to the output diffusion of a selected NOR element are aligned to minimize the length of such signal net and prevent crossings of signal nets; moreover, each such input device is arranged along the input channel of its corresponding NOR element to allow passage of other signal nets. The ability to define an input device anywhere along the input channel of a NOR element provides maximum flexibility without a corresponding reduction in packing density.

The integrated circuit arrangement of this invention, therefore, consists of an ordered, or one-dimensional, array of NOR elements as distinguished from the coordinate, or two-dimensional, arrays characteristic of the prior art. Each NOR element is formed in elongated fashion, the diffusion length of each element being subsubstantially greater than that of prior art arrangements; in prior art arrangements, the diffusion length of each NOR element was minimized so as to increase packing density of the NOR elements proper. Extending the diffusion length of the NOR elements when arranged in a one-dimensional array allows that device and interconnection areas can be overlapped and total packing density substantially increased. The minimum height of the basic diffusion pattern is determined by diffusion length of that NOR element having largest sum of the following factors, as weighted by spacing requirements: (1) the number of input devices in such NOR element, and (2) the number of signal nets which cross over the input channel of such NOR element. The minimum width of the basic diffusion pattern is determined by the number of NOR elements required to generate a particular complex logical function.

DESCRIPTION OF THE DRAWINGS

The foregoing and other objects, features and advantages of the invention will be apparent from the following more particular description of a preferred embodiment of the invention, as illustrated in the accompanying drawings.

DESCRIPTION OF THE PREFERRED EMBODIMENT

Figures 1A, 1B, 2:
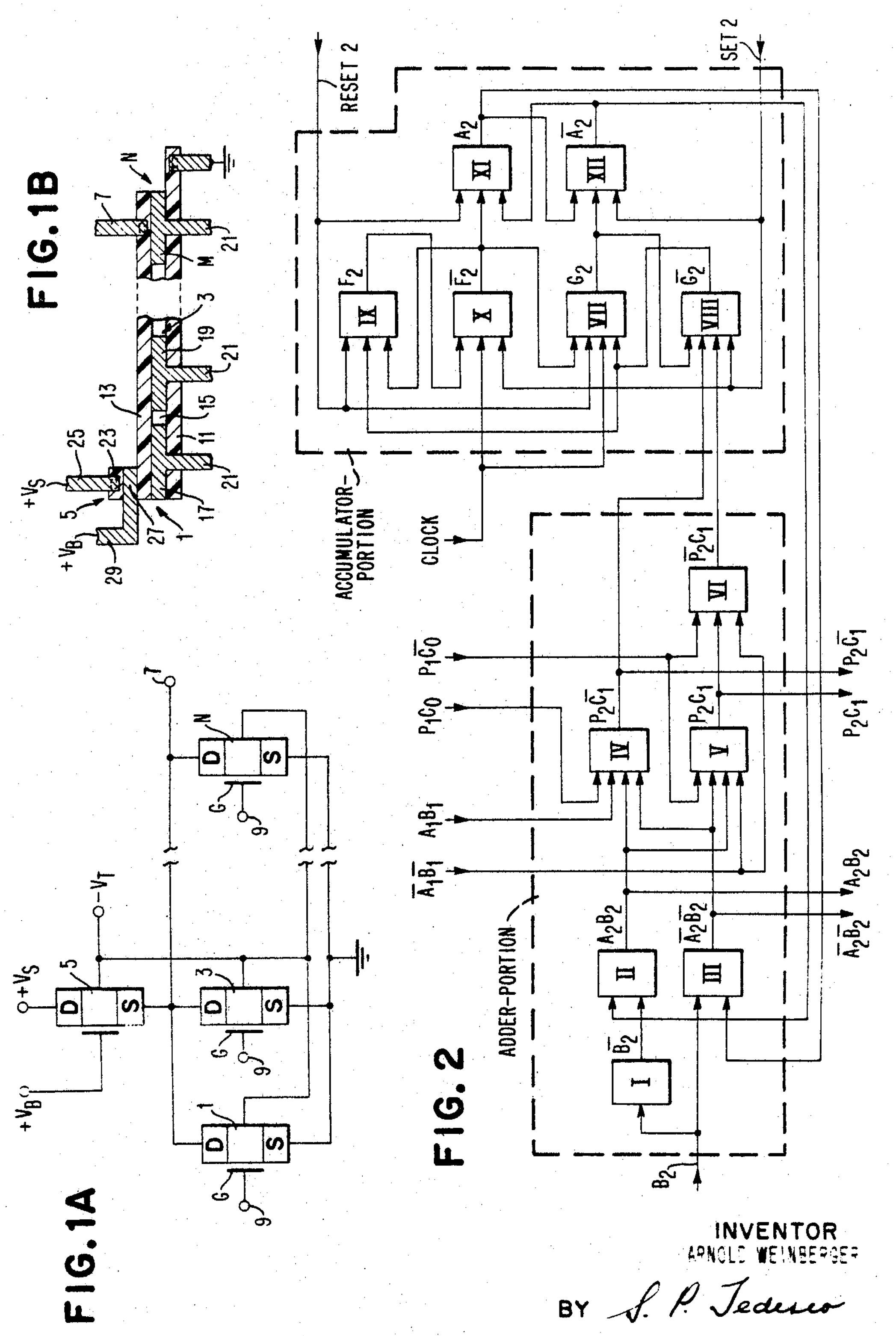
FIG. 1A is a schematic of a NOR element comprising insulated-gate field effect transistors.
FIG. 1B is a top view of a NOR element as shown in FIG. 1A when integrated in accordance with prior art techniques.
FIG. 2 is a block diagram of single-bit position of an adder-accumulator arrangement formed of NOR elements.

A NOR logical element illustrated in FIG. 1A comprises a parallel arrangement of NPN insulated-gate field effect transistors 1, 3, . . . N, each defining an input device, which is serially arranged with a load NPN insulated-gate field effect transistor 5. Each input device, 1, 3, . . . N includes drain electrode D, source electrode S, and gate electrode G. An output terminal 7 is defined at the junction of source electrode S of load device 5 and drain electrodes D of input transistors 1, 3, . . . N. Drain electrode D of load transistor 5 is connected to power supply $+V_S$; source electrodes S of input transistors 1, 3, . . . N are connected to a constant potential, e.g., ground. Gate electrode G of load device 5 is connected to bias voltage $+V_B$. Input devices 1, 3, . . . N and, also, load device 5 can be formed in a same semiconductor wafer, as shown in FIG. 1B, which is connected to a negative voltage supply $-V_T$. Also, gate electrode G of input devices 1, 3, . . . N are connected to input terminals 9, respectively, whereat logical input signals are applied.

When the NOR element of FIG. 1 is integrated on a P-type semiconductor wafer, as shown in FIG. 1B, source and drain electrodes S and D of input transistors 1, 3, . . . N can be defined by parallel N-type diffusions 11 and 13 which define ground and output diffusions, respectively. Portion 15 of the semiconductor surface between ground and output diffusions 11 and 13 forms the input channel of the NOR element along which input transistors 1, 3, . . . N are defined by metallic gate electrodes 17, 19, . . . M, respectively. Each gate electrode 17, 19, . . . M and that portion of input channel 15 with which it is registered defines a distinct insulated-gate field effect transistor. Normally, gate electrodes 17, 19, . . . M are insulated from input channel 15 by a thin insulating layer, not shown, the respective lengths of diffusions 11 and 13 being such as to accommodate only the required number of gate electrodes. Logical signal inputs are directed to gate electrodes 17, 19, . . . M along metallic conductors 21, respectively, which pass over the thin insulating layers, not shown.

An additional N-type diffusion 23 spaced from output diffusion 13 of input transistors 1, 3, . . . N defines drain electrode D of load device 5 and is connected to power supply $+V_S$ along metallic conductor 25. Gate electrode 27 is registered with the channel between the output diffusion 13 and power supply diffusion 23 and is connected to bias supply $+V_B$ along metallic conductor 29. The equivalent resistance of load device 5 is substantially linearized when gate electrode 27 is biased independently; altenatively, gate electrode 27 can be connected to power supply $+V_S$.

The operation of a NOR element as illustrated in FIGS. 1A and 1B can be compared to that of a voltage-divider arrangement, each input device 1, 3, . . . N defining such an arrangement with load device 5. In the quiescent state, gate electrodes G are "off" and substantially no source-drain current $I_{SD}$ flows along input transistors 1,3, . . . N; also, load device 5 is only slightly conductive, the effective resistance being determined by the magnitude of bias supply $+V_B$. Accordingly, the voltage level at output terminal 7 is substantially equal to the voltage supply $+V_S$ and corresponds to the "on" condition of a gate electrode. When gate electrode G is "on," the respective source-drain current $I_{SD}$ is supported by a surface conduction mechanism due to electric fields generated by the gate electrode G when "on" which modulate majority carrier density along the semiconductor surface. Accordingly, in FIG. 1B, when one or more gate electrodes 17, 19, . . . M are "on," the corresponding input device 1, 3, . . . N is conductive and the voltage along output diffusion 13 and appearing at output terminal 7 is determined by the respective transconductance $g_m$ of the load device 5 and that of the particular input device driven into conduction. Accordingly, the voltage level at output terminal 7 reduces to substantially ground potential which corresponds to the "off" condition of a gate electrode. The generation of the voltage levels "on" and "off," respectively, at output terminal 7 when none of the gate electrodes G of input devices 1, 3, . . . N is "on" and when one or more of such gate electrodes are "on" is indicative of a logical NOR function.

The arrangement shown in FIG. 2 utilizes NOR logic for generating a complex logical function and incorporates both combinational and sequential logic. FIG. 2 illustrates a single bit-position, e.g., bit-position 2, of a multi-bit adder-accumulator arrangement; other bit-positions in the adder-accumulator register would repeat the logic illustrated. Signals which emanate from a particular bit-position have been identified by corresponding subscripts.

The adder-portion comprises NOR elements I through VI and adds binary digits $A_2$ and $B_2$ together with the binary input carry $C_1$ from bit-position 1. The outputs are the binary sum and output carry digits $S_2$ and $C_2$, respectively. The signal $A_2$ representing the binary digit $A_2$ as well as the dual signal $\overline{A}_2$ are supplied from the accumulator-portion. The signal $B_2$ representing the binary digit $B_2$ is supplied from an external register, not shown. The dual signal $\overline{B}_2$ is generated by NOR element I. The input carry $C_1$, the output carry $C_2$, and the sum $S_2$ are each represented by two signals which, if logically OR'ed, would generate a single representative signal. Using standard equations for the sum to represent the condition when an odd number of inputs $A_2$, $B_2$ and $C_1$ are "1,"

$$\begin{aligned}S_2&=\overline{A}_2\overline{B}_2C_1+\overline{A}_2B_2\overline{C}_1+A_2\overline{B}_2\overline{C}_1+A_2B_2C_1\\&=(\overline{A}_2\overline{B}_2+A_2B_2)C_1+(\overline{A}_2B_2+A_2\overline{B}_2)\overline{C}_1\\&=\overline{P}_2C_1+P_2\overline{C}_1\end{aligned}$$

$P_2$ represents the condition when $A_2$ and $B_2$ are unequal, i.e., $(\overline{A}_2B_2+A_2\overline{B}_2)$, and $\overline{P}_2$ represents the condition when $A_2$ and $B_2$ are equal, i.e., $(\overline{A}_2\overline{B}_2+A_2B_2)$. Thus, the sum is represented by two signals $\overline{P}_2C_1$ and $P_2\overline{C}_1$ generated by NOR elements VI and IV, respectively.

Using standard equations for the output carry $C_2$ which represents the condition when two or all of the inputs $A_2$, $B_2$, and $C_1$ are "1,"

$$\begin{aligned}C_2&=A_2B_2C_1+A_2B_2\overline{C}_1+A_2\overline{B}_2C_1+\overline{A}_2B_2C_1\\&=A_2B_2(C_1+\overline{C}_1)+(A_2\overline{B}_2+\overline{A}_2B_2)C_1\\&=A_2B_2+P_2C_1\end{aligned}$$

Thus, the output carry $C_2$ is represented by two signals $A_2B_2$ and $P_2C_1$ generated by NOR elements II and V, respectively.

Similarly, the standard equations for the dual of the output carry $\overline{C}_2$ which represents the condition when one or none of the inputs $A_2$, $B_2$, and $C_1$ is "1,"

$$\begin{aligned}\overline{C}_2&=\overline{A}_2\overline{B}_2C_1+\overline{A}_2B_2\overline{C}_1+A_2\overline{B}_2\overline{C}_1+\overline{A}_2\overline{B}_2\overline{C}_1\\&=\overline{A}_2\overline{B}_2(C_1+\overline{C}_1)+(\overline{A}_2B_2+A_2\overline{B}_2)\overline{C}_1\\&=\overline{A}_2\overline{B}_2+P_2\overline{C}_1\end{aligned}$$

Thus, the dual of the output carry $\overline{C}_2$ is represented by two signals $\overline{A}_2\overline{B}_2$ and $P_2\overline{C}_1$ generated by NOR elements III and IV, respectively.

The input carry $C_1$ and its dual $\overline{C}_1$ are represented similarly by two signals each and generated in bit-position 1. Thus, $$C_1=A_1B_1+P_1C_0$$
$$\overline{C}_1=\overline{A}_1\overline{B}_1+P_1\overline{C}_0$$

The actual signals are formed according to the standard equations for NOR elements as follows:

NOR element II: $A_2B_2=\overline{A_2+B_2}$

NOR element III: $A_2B_2=\overline{A_2+B_2}$

NOR element IV:

$$P_2C_1=\overline{P_2+C_1}=\overline{A_2B_2+A_2B_2+A_1B_1+P_1C_0}$$

NOR element V:

$$P_2C_1=\overline{P_2+C_1}=\overline{A_2B_2+A_2B_2+A_1B_1+P_1C_0}$$

NOR element VI: $P_2C_1=\overline{P_2+C_2}=\overline{P_2C_1+A_1B_1+P_1C_0}$

The accumulator-portion comprising NOR elements VII, VIII, IX, X, XI, and XII, accepts the sum digit $S_2$ from the adder-portion (NOR elements IV and VI) at NOR element VIII when CLOCK changes from a "1" state, or high-voltage state, to a "0," or low-voltage, state and SET 2 and RESET 2 are both in a "0" state. The accepted digit, i.e., the accumulator digit, is indicated by the signal $A_2$ and its dual $\overline{A}_2$. A binary digit "1" or "0" can also be forced into the accumulator-portion by means of signals SET 2 and RESET 2, overriding the CLOCK and $S_2$ conditions. When SET 2 and RESET 2 are "0" and "1," respectively, a "0" is stored in the accumulator-portion as indicated by the signal $A_2$; when SET 2 and RESET 2 are "1" and "0," respectively, a "1" is stored in the accumulator-portion as indicated by the signal $A_2$.

When SET 2 is in a "1" state while RESET 2 is in a "0" state, NOR elements VIII, X, and XII are enabled such that the respective outputs $\overline{G}_2$, $\overline{F}_2$, and $\overline{A}_2$ are each "0." Signals RESET 2, $\overline{F}_2$, and $\overline{A}_2$ applied as inputs to NOR element XI are each "0" so as to disable NOR element XI whereby output signal $A_2$ is "1." Thus, signals $A_2$ and its dual $\overline{A}_2$ are in states "1" and "0," respectively, representing the accumulator digit value "1."

When RESET 2 is in a "1" state while SET 2 is in a "0" state, NOR elements VII, IX, and XI are enabled such that the respective outputs $G_2$, $F_2$, and $A_2$ are each "0." Signals SET 2, $G_2$, and $A_2$, applied as inputs to NOR element XII, are each "0" so as to disable NOR element XII whereby output signal $\overline{A}_2$ is "1." Thus, signals $A_2$ and its dual $\overline{A}_2$ are in states "0" and "1," respectively, representing the accumulator digit value "0,"

When both SET 2 and RESET 2 are in a "1" state, NOR elements VII, VIII, IX, X, XI, and XII are enabled such that the respective outputs $\overline{G}_2$, $G_2$, $F_2$, $\overline{F}_2$, $A_2$ and $\overline{A}_2$ are each "0." This condition is not used.

When both SET 2 and RESET 2 are in a "0" state, the accumulator-portion consists of three NOR latching arrangements VII/VIII, IX/X, and XI/XII. Latching arrangements VII/VIII and IX/X serve as temporary storage for the sum digit $S_2$ while waiting for CLOCK to change from a "1" to a "0" state. Latching arrangement X/XII serves as the memory element for the accumulator digit $A_2$ and is set to the value of the sum digit $S_2$ when CLOCK reverts from "1" to a "0" state. The signals $A_2$ and its dual $\overline{A}_2$ enter the NOR elements III and II, respectively, as the binary input $A_2$ of the adder-portion. The CLOCK signal is operated at a frequency sufficiently low so as to permit the signals $P_2\overline{C}_1$ and $\overline{P}_2C_1$, representing the sum digit $S_2$, from NOR elements IV and VI, respectively, to arrive at a steady state condition when CLOCK changes from a "1" to a "0" state.

Latches VII/VIII and IX/X are cross coupled, i.e., signal $\overline{F}_2$ is applied as an input of NOR element VII and signal $\overline{G}_2$ is applied as an input to NOR element IX. When no other inputs of state "1" are present in the combination of these two latches, i.e., when CLOCK and signals $P_2\overline{C}_1$ and $\overline{P}_2C_1$ are "0," latches VII/VIII and IX/X are in one of two steady states, i.e., either both in state "1/0" or in state "0/1." Under these conditions, latch XI/XII is forced into the same state, i.e., "1/0" or "0/1," respectively, by input signals $\overline{F}_2$ and $G_2$ from NOR elements X and VII, respectively.

While CLOCK is in state "0," a change of the sum digits $S_2$ (the equivalent signal as represented by the OR'ed function of signals $P_2\overline{C}_1$ and $\overline{P}_2C_1$) does not change the state of latch XI/XII. For example, if all latches VII/VIII, IX/X, and XI/XII are in state "1/0," a change in sum digit $S_2$, i.e., either $P_2\overline{C}_1$ or $\overline{P}_2C_1$ is "1," has no effect on any latch; while if all latches VII/VIII, IX/X, and XI/XII are in state "0/1," a change in sum digit $S_2$ to "1," merely enables NOR element VIII such that its output signal $\overline{G}_2$ is "0."

To change the accumulator digit $A_2$ to reflect an opposite value in the sum digit $S_2$, CLOCK must go through a transition from a "1" to a "0" state while the sum digit $S_2$ is in the opposite condition. For example, when latches VII/VIII, IX/X, and XI/XII are each in a "1/0" state representing the accumulator digit "1," a change of CLOCK from a "0" to a "1" state enables NOR element VII such that the output signal $G_2$ is "0." If sum digit $S_2$ is changed to "0," NOR element VIII is disabled and its output signal $\overline{G}_2$ is "1." When signal $\overline{G}_2$ is "1," NOR element IX is enabled whereby its output signal $F_2$ is "0." When CLOCK reverts to a "0" state, NOR element X is disabled and its output signal $\overline{F}_2$ is "1" whereby NOR element XI is enabled and its output signal $A_2$ is "0." When signal $A_2$ is "0," latch XI/XII is set to a "0/1" state representing the accumulator digit "0." When latches VII/VIII, IX/X, and XI/XII are each in a "0/1" state representing the accumulator digit "0," a change of CLOCK from a "0" to a "1" state enables NOR element X such that its output signal $\overline{F}_2$ is "0." If sum digit $S_2$ is changed to "1," NOR element VIII is enabled and its output signal $\overline{G}_2$ is "0." When $\overline{G}_2$ is "0," NOR element IX is disabled and its output signal $F_2$ is "1." When CLOCK reverts to a "0" state, NOR element VII is disabled and its output signal $G_2$ is "1" which, in turn, enables NOR element XII whereby its output signal $\overline{A}_2$ is "0" so as to set latch XI/XII in a "1/0" state representing the accumulator digit "1."

Figure 3B:
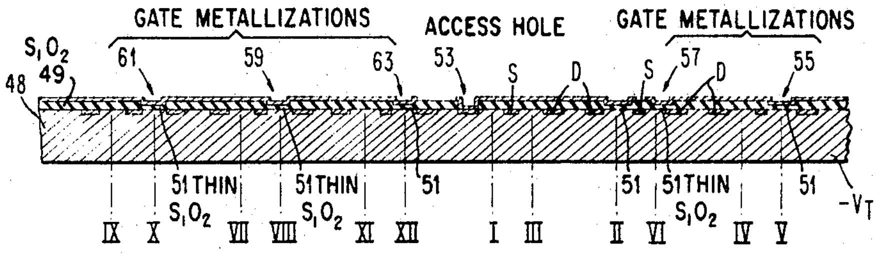
FIG. 3B is a cross-sectional view taken along the line 3B—3B of FIG. 3A.
Figure 3A:
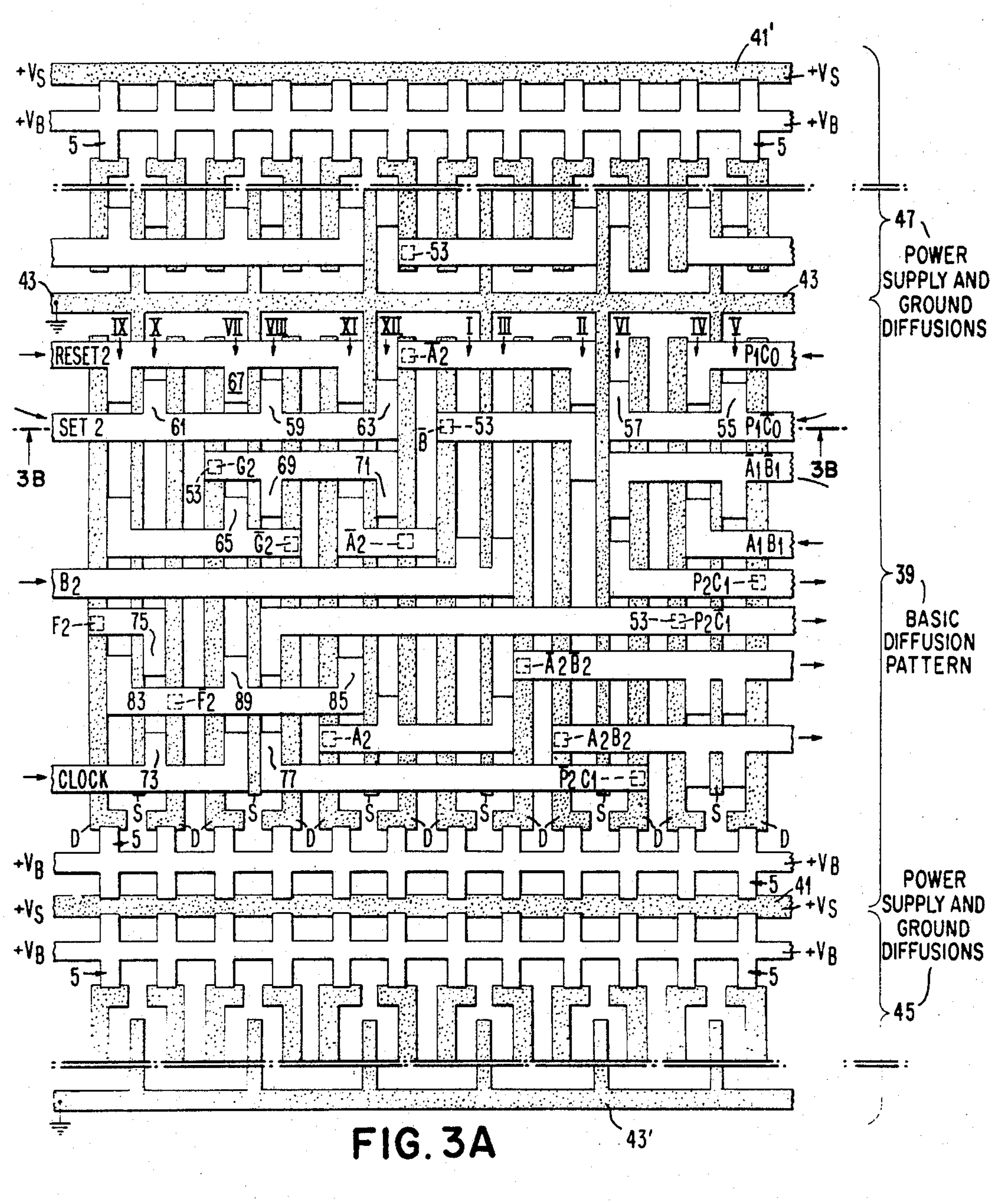
FIG. 3A is a top view of the physical layout of the arrangement of FIG. 2 when integrated in accordance with the present invention.

FIGS. 3A and 3B are top and cross-sectional views of the adder-accumulator arrangement illustrated in FIG. 2 when integrated in accordance with the present invention. To facilitate comparison between FIGS. 2, 3A, and 3B, output diffusions of NOR elements I through XII and the individual signal nets connected thereto have been identified where connected through access holes in the insulating layer (see references 49 and 53 in FIG. 3B) by corresponding logical functions; also, signal nets directing externally generated inputs have been correspondingly identified. As illustrated, the integrated arrangement comprises a basic diffusion pattern 39 including a pair of spaced vertical diffusions 41 and 43 for distributing the power supply $+V_S$ and a reference potential, e.g., ground, to NOR elements I through XII. Also, a plurality of spaced parallel diffusions are formed intermediate power supply and common ground diffusions 41 and 43, adjacent diffusions identified as S and D identifying ground and output diffusions, respectively, of each of the NOR elements I through XII. Additional power supply and common ground diffusions 41' and 43' can be formed in spaced parallel relationship with power supply and common ground diffusions 41 and 43, respectively, such that any number of mirror images 45 and 47, partially shown, of basic diffusion pattern 39 can be provided which share a common power supply or ground diffusion so as to implement the same or other subsystem functions, e.g., other adder-accumulator arrangements. Referring particularly to diffusion pattern 39, each of the ground diffusions S is formed as an extension of common ground diffusion 43. Each of the output diffusions D includes a right-angle extension, the semiconductor surface intermediate such extension and power supply diffusion 41 defines the load channel for the corresponding NOR element. Also, the semiconductor surface intermediate each ground diffusion S and output diffusion D defines the input channel of a NOR element along which any number of input devices, i.e., gate metallizations, can be defined. Any portion of the input channel or a NOR element, as hereinafter described, can be utilized to define an input device; also, input devices to each of the NOR elements I through XII are spaced along the input channel so as to accommodate signal nets for connecting output diffusions D of selected NOR elements to one or more input devices of other NOR elements defined in the one-dimensional array.

The number of spaced parallel diffusions in a basic diffusion pattern is determined by the number of NOR elements required to generate a particular complex logical function. For example, to form NOR elements I through XII, basic diffusion pattern 39 comprises six ground diffusions S and twelve output diffusions D, each ground diffusion S being common to adjacent NOR elements in the one-dimensional array. Any number of NOR elements can be defined by increasing the number of input and output diffusions S and D, and, also, by extending the respective lengths of power supply and common ground diffusions 41 and 43.

The basic diffusion patterns 39, 45 and 47 illustrated in FIGS. 3A and 3B can be formed concurrently by conventional diffusion processes. For example, semiconductor wafer 48, e.g., of silicon, can be exposed at a temperature between 950° and 1150° C. in either an oxygen or water vapor atmosphere for a time sufficient to form genetically a silicon dioxide layer, not shown, which can be employed as a diffusion mask. When formed, openings corresponding to the diffusion patterns to be formed over the surface of wafer 48 are etched in the silicon dioxide layer by conventional photoresist techniques. A typical process includes the application of a thin layer of positive photoresist material, over the silicon dioxide which is optically exposed through a photographic mask corresponding to the desired pattern of diffusion to be effected. The exposed layer of photoresist material is developed, i.e., the exposed portions are washed away by a suitable solvent, and the remaining pattern is cured at an elevated temperature. Portions of the silicon dioxide layer exposed through the photoresist mask are etched by a suitable etchant, e.g., hydrofluoric acid, whereby "diffusion windows" corresponding to the diffusion patterns are defined.

The photoresist mask is removed by an appropriate solvent, e.g., hot chromic acid or sulfuric acid.

Wafer 48 with the silicon dioxide "diffusion mask" is exposed, for example, to gaseous phosphorous pentoxide at an elevated temperature in the range of 1050° C. to form N-type basic diffusion patterns 39, 45 and 47 along with power supply diffusions 41 and 41′ and the common ground diffusions 43 and 43′. The silicon dioxide "diffusion mask" is stripped and wafer 48 subjected to a subsequent oxidation process to form genetically silicon dioxide layer 49 of uniform thickness. The thickness of silicon layer 49 is not critical but should be of sufficient thickness to prevent "field effect" crosstalk along the input channel of a NOR element when traversed by an energized signal net.

When silicon dioxide layer 49 has been formed, "personality" for generating a particular complex logical function is imparted to diffusion pattern 39 by a two-step process, each step capable of being effected by conventional techniques. For example, a proper photoresist mask is defined, as hereinabove described, to effect a partial-etching process so to reduce the thickness of selected portions 51 of silicon dioxide layer 49, see FIG. 3B, whereat input devices to each of the NOR elements I through XII and, also, load devices 5 are to be defined. Subsequently, a proper photoresist mask is defined for effecting a through-etching process to define a pattern of access holes 53 (see FIG. 3B) through silicon dioxide 49 to power supply diffusions 41 and 41′, common ground diffusions 43 and 43′ and output diffusions D. The photoresist masks for effecting the partial-etching and through-etching processes are defined in accordance with the desired physical layout of the input devices to NOR elements I through XII, load devices 5, and, also, to accommodate an arrangement of signal nets for implementing the desired complex logical functions. It is evident that NOR elements I through XII can be arranged in any sequence in the one-dimensional array and, also, a particular complex logical function can be implemented by any one of many arrangements of signal nets.

The logical arrangement is integrated by a single metallization process to define the gate electrodes of the input devices to each of the NOR elements I through XII and load devices 5, nets for interconnecting output diffusion D of each NOR element and an input device of one or more of the other NOR elements and, also, gate electrodes of load devices 5 as well as necessary connections to power supply diffusions 41, 41′ and common ground diffusions 43 and 43′. Preferably, input devices of several NOR elements to be commoned to a particular output diffusion D of another NOR element are aligned such that the interconnecting signal net is formed in one or more straight line segments. For example, in FIGS. 3A and 3B, input devices defined by gate metallizations 55 and 57 to NOR elements V and VI are aligned such that signal net $P_1\overline{C}_0$ is defined in a straight line; also, input devices defined by gate metallizations 59, 61, and 63 to NOR elements VIII, X, and XII are aligned such that signal net SET 2 is defined in a straight line. Obviously, signal nets need not be formed in a straight line and, for example, may include a right-angle bend, not shown, to interconnect non-aligned input devices of several NOR elements.

Input devices are distributed and spaced along the input channels of corresponding NOR elements I through XII in staggered fashion such that signal nets can pass therebetween and over thicker portions of the silicon dioxide layer 49 to effect necessary interconnections. For example, input devices defined by gate metallizations 65 and 67 are spaced along the input channel of NOR element VII to allow signal net SET 2 to interconnect input devices defined by gate metallizations 59, 61 and 63 to NOR elements VIII, X, and XII and, also, signal net $G_2$ to interconnect the output diffusion D of NOR element VII to input devices defined by gate metallizations 69 and 71 to NOR elements VIII and XII, respectively. Also, input devices defined by gate metallizations 73 and 75 to NOR element X and input devices defined by gate metallizations 77 and 69 to NOR element VIII are distributed to allow signal net $\overline{F}_2$ to pass over the respective input channels to interconnect output diffusion D of NOR element X to gate metallizations 89, 83, and 85 defining input devices to NOR elements VII, IX, and XI, respectively. It is noted that a signal net interconnecting an output diffusion D and one or more input devices to NOR elements I through XII defined in the one-dimensional array, e.g., as signal $\overline{B}_2$, are supported over thicker portions of silicon dioxide layer 49 and range over the basic diffusion pattern. Also, input devices to each of the NOR elements I through XII and, also, the signal nets are arranged such that signal nets do not cross over each other and the complete interconnection arrangement is defined by a single level of metallization.

To impart the "personality" to the basic diffusion pattern 39, and referring particularly to basic diffusion pattern 39, a thin metallic layer, not shown, e.g., of aluminum, is deposited initially over the entire surface of silicon dioxide layer 49 and within access holes 53. A layer of positive photoresist material, not shown, is formed over the metallic film and exposed optically through a photographic mask corresponding to the desired patterns of gate metallizations and signal nets. The layer of photoresist material is developed and cured, as hereinabove described, so as to be resistant to an appropriate aluminum etchant, e.g., sodium hydroxide. Portions of the aluminum film exposed through the photoresist pattern are removed by etching, the desired pattern of gate metallizations and signal nets, as illustrated, being defined by remaining portions of the aluminum film underlying the photoresist pattern. The photoresist pattern is subsequently removed, the integration being completed and appropriate external connections can be applied as indicated by arrows, to the integrated arrangement. It is evident that the input and output signals of a complex logic arrangement, e.g., defined by basic diffusion pattern 39, can be received from or directed to other complex logical arrangements, e.g., as defined by basic diffusion patterns 45 and 47.

In the layout of FIG. 3B, NOR elements I through VI can be arranged in any sequence within the one-dimensional array so as to minimize the respective lengths of the signal nets required to generate the desired complex logical function and, also, to minimize the height of the basic diffusion pattern 39, as hereinabove described. Also, the signal nets can be arranged such that two or more signal nets, e.g., signal nets $P_1\overline{C}_0$, $\overline{B}_2$ and SET 2, can be arranged in a same horizontal track whereby the height of basic diffusion pattern 39 is minimized. Also, the above-described technique for achieving high-density complex logic arrangements from a basic diffusion pattern can be attached to accommodate special situations. For example, when one or more NOR elements have an excessive FAN–IN, two or more output diffusions D defined in a basic diffusion pattern can be multipled along a single signal net and single load device 5 provided to one such output diffusion, to define a single NOR element having an input channel of increased length for accommodating a greater number of input devices. In addition, if a logical output signal is required to drive an exceptionally high load, larger driving signals can be obtained by multipling two or more output diffusions D and the corresponding input devices such that a multiplicity of load devices 5 and input channels are arranged in parallel to define each driving logical element. In such latter arrangements, the length-to-width ratios of the equivalent logical element and the equivalent load device and, hence, the current-carrying capacity are increased. Furthermore. the standardization aspects hereinabove described can be applied to other techniques, e.g., thin film transistors, bipolar transistors, etc., and other logic elements, e.g., NAND elements, multi-level elements, etc. For example, a plurality of parallel diffusions may be assigned, outside diffusions defining ground and output diffusions, respectively, and inside diffusions defining a plurality of distinct input channels along which one or more input devices can be provided. Each input channel, therefore, provides the first level of logic and the combination of input channels comprises the higher level of logic to generate, for example, an OR–NAND function.

While the invention has been particularly shown and described with reference to a preferred embodiment thereof, it will be understood by those skilled in the art that various changes in form and details may be made therein without departing from the spirit and scope of the invention.

What is claimed is:

1. An integrated circuit arrangement comprising:

a plurality of elongated logical means arranged in an ordered one-dimensional array, each of said logical means including at least one output electrode and at least one input electrode, signal nets interconnecting output electrodes of selected logical means and one or more input electrodes of other logical means in said one-dimensional array, said signal nets ranging over said one-dimensional array in non-ordered fashion to integrate said logical means to generate a particular logical function, and means including load means connected to each of said output electrodes for supplying operating voltages to said logical means in said one-dimensional array.

2. An integrated circuit arrangement as defined in claim 1 further including input and output signal nets connected to input electrodes and output electrodes, respectively, of particular ones of said logical means for directing logical input and output signals to and from said integrated circuit arrangement.

3. An integrated circuit arrangement comprising:

a plurality of logical means formed in elongated fashion and arranged in a one-dimensional array on a planar support structure, each of said logical means including an output electrode and at least one input electrode, means including individual load means connected to said output electrodes for supplying operating voltages to said logical means in said one-dimensional array, a plurality of signal nets ranging over said one-dimensional array in non-ordered fashion, each of said signal nets interconnecting input electrodes of one or more logical means to one or more output electrodes of other logical means according to a particular logical function to be generated, particular ones of said signal nets interconnecting input and output electrodes of non-adjacent logical means in said one-dimensional array, and input and output signal nets connected to input and output electrodes, respectively, of particular logical means for directing logical input and output signals to and from said integrated circuit arrangement.

4. An integrated circuit arrangement as defined in claim 3 wherein two or more input electrodes of different logical means interconnected along a same signal net are aligned and said same signal net is formed as a straight-line segment.

5. An integrated circuit arrangement as defined in claim 3 wherein said signal nets are defined as straight-line segments oriented in a direction substantially transverse to said one-dimensional array, and input electrodes interconnected along said signal nets are located along the length of corresponding ones of said logical means so as to be contacted by an appropriate signal net.

6. An integrated arrangement as defined in claim 5 wherein said logical means are formed in a same length, said length being determined by that one of said logical means having the largest sum of the factors: (1) number of input electrodes plus spacing between electrodes, and (2) number of signal nets ranging over said logical means plus spacing between signal nets.

7. A complex logical circuit arrangement comprising:

a one-dimensional array of logical elements each having elongated first and second electrodes connected along a region of semiconductor material, said semiconductor region defining an input channel to said logical element, means connecting said first electrodes of said logical elements to a reference potential and said second electrodes of said logical elements along individual load means to an operating potential, conduction along input channels of each of said logical elements being normally in one state, insulating means formed over said one-dimensional array, each of said logical elements further including one or more input means distributed along said input channel, said distributed input means being operative to change said input channel to a second state, conductive means ranging over said one-dimensional array in non-ordered fashion and supported on said insulating means for interconnecting second electrodes of selected ones of said logical elements to input means of one or more of others of said logical elements in accordance with a particular logical function to be generated, and additional conductive means connected to input devices and second electrodes of particular ones of said logical elements for directing logical input and output signals, respectively, to and from said logical circuit arrangement.

8. A complex logical circuit arrangement as defined in claim 7 wherein two or more input devices of said other logical elements to be connected along a same conductive means are aligned transverse to said one-dimensional array, said input means of logical elements arranged in said one-dimensional array intermediate said selected logical elements and said other logical elements being distributed along corresponding input channels such that said same conductive means are formed in straight-line segments.

9. A complex logical arrangement as defined in claim 7 wherein said first electrodes of adjacent ones of said logical elements in said one-dimensional array are common.

10. A complex logical arrangement comprising:

a plurality of elongated diffusions of first conductivity type formed in a semiconductor surface of second conductivity type, portions of said semiconductor surface intermediate adjacent ones of said diffusions defining input channels of logical elements arranged in a one-dimensional array, means connecting said first diffusions to a reference potential and said second diffusions along individual load means to an operating potential, an insulating layer formed over said plurality of elongated diffusions, one or more gate electrode means formed over said insulating means and distributed in registered fashion along the input channels of each of said logical elements, portions of said insulating layer supporting said gate electrode means being of reduced thickness such that said gate electrode means are operative to modulate conduction along registered portions of said input channel, the distribution of said gate electrodes along each of said input channels being dissimilar, conductive means formed over said insulating layer and ranging over said one-dimensional array in nonordered fashion for connecting second diffusions of selected ones of said logical elements and gate electrodes of others of said logical elements in accordance with a particular logical function to be generated, and
additional means for applying logical input signals to gate electrode means of particular logical elements and for directing said logical function where generated from said logical arrangement.

11. The complex logical arrangement as defined in claim 10 wherein gate electrode means connected along a same conductive means are aligned whereby said same conductive means is formed as a straight-line segment.

12. The complex logical arrangement as defined in claim 11 wherein particular ones of said conductive means connecting said second diffusions of said selected logical elements and said gate electrode means of said other logical elements transverse input channels of one or more logical elements arranged intermediate said selected and said other logical elements in said one-dimensional array, said gate electrode means of said intermediate logical elements being distributed along corresponding input channels to provide straight-line access for said particular conductive means between said connected second diffusions and said gate electrode means.

13. The complex logical arrangement as defined in claim 12 wherein the thickness of said insulating layer supporting said conductive means is of sufficient thickness to prevent "field effect" crosstalk in input channels of said intermediate logical elements.

14. The complex logical arrangement as defined in claim 13 wherein said conductive means and said gate electrode means connected therealong are defined by a same metallic pattern, a portion of said metallic pattern passing through said insulating layer to electrically contact the second diffusion of a selected logical element.

15. A complex logical arrangement comprising:
a first and second spaced parallel diffusion of first conductivity type formed in a semiconductor surface of second conductivity type, said first diffusion including a first plurality of parallel elongated extensions directed toward said second diffusion,
a plurality of third elongated diffusions of first conductivity type formed in said semiconductor surface intermediate adjacent ones of said extensions and spaced from said first and second diffusions, portions of said semiconductor surface intermediate said extensions and said third diffusions defining input channels of logical elements arranged in a one-dimensional ordered array,
means connecting said first diffusion to a reference potential and said second diffusion to an operating potential,
insulating means formed over said first, said second, and said third diffusions, said insulating layer including a pattern of access holes to said third diffusions, selected portions of said insulating means registered over input channels of said logical elements and said semiconductor surface intermediate said second and third diffusions being of reduced thickness,
a plurality of metallic gate electrodes supported on portions of said insulating means of reduced thickness,
a plurality of signal nets ranging over said one-dimensional array in nonordered fashion and connecting selected ones of said gate electrodes to selected ones of said third diffusions in accordance with a particular logical function to be generated, an additional signal net connecting each said gate electrodes supported over said semiconductor surface intermediate said second and third diffusions whereby a load device to each of said logical elements is defined, and
means connected to gate electrodes and third diffusions of particular ones of said logical elements for directing logical input and output signals, respectively, to and from said logical arrangement.

16. A complex logical arrangement comprising:
a plurality of elongated diffusions of first conductivity type formed in spaced parallel fashion in a semiconductor surface of second conductivity type, portions of said semiconductor surface intermediate adjacent ones of said diffusions defining input channels of logical elements arranged in a one-dimensional array,
means connecting said first diffusions to a reference potential and said second diffusions along individual load means to an operating potential,
an insulating layer formed over said plurality of elongated diffusions,
at least one gate electrode means associated with each of said logical elements and supported on said insulating layer, said gate electrode means being registered with and spaced along the input channel of said associated logical element, portions of said insulating layer supporting said gate electrode means being of reduced thickness such that said gate electrode means are operative to electric-field modulate conduction along registered portions of said input channel,
interconnecting means supported on said insulating means and ranging over said one-dimensional array in nonordered fashion for connecting second diffusions of selected ones of said logical elements through said insulating layer and to said gate electrode means of others of said logical elements in accordance with a particular logical function to be generated, and
additional means for applying logical input signals to gate electrode means associated with particular logical elements and for directing said particular logical functions where generated from said logical arrangement.

17. A method of forming an integrated circuit array for generating complex logical functions comprising the steps of:
arranging a plurality of elongated logical means in an ordered one-dimensional array, each of said logical means including at least one output electrode and at least one input electrode,
interconnecting output electrodes of selected logical means and one or more input electrodes of other logical means along a plurality of signal nets, said signal nets ranging over said one-dimensional array in nonordered fashion to integrate said logical means to generate a particular logical function,
supplying operating voltages along load means connected to each of said output electrodes of said logical means in said one-dimensional array, and
directing logical input and output signals to input electrodes and from output electrodes, respectively, of particular logical means in said one-dimensional array.

18. A method of forming integrated circuit arrangements for generating complex logical functions comprising the steps of:
arranging a plurality of logical means in an ordered one-dimensional array, each of said logical means including an output electrode and at least one input electrode,
supplying operating potentials through individual load means to output electrodes of said logical means,
supporting a plurality of signal nets in insulated fashion over said one-dimensional array to interconnect said logical means in accordance with a particular logical function to be generated,
arranging said signal nets in nonordered fashion such as to range over said one-dimensional array in nonordered fashion, particular ones of said signal nets interconnecting input electrodes of one or more logical means and the output electrode of at least another logical means according to the logical function to be generated, particular ones of said signal nets interconnecting input and output electrodes of nonadjacent logical means in said one-dimensional array, and directing logical input and output signals to input electrodes and from output electrodes, respectively, of particular logical elements in said one-dimensional array.

19. The method of claim 18 including the further steps of aligning two or more input electrodes of different logical means to be interconnected along a same signal net in a direction substantially transverse to said one-dimensional array, and forming said same signal net as a straightline segment whereby the length of said same signal net is minimized.

20. The method of claim 19 including the further step of distributing input electrodes of logical elements arranged intermediate said nonadjacent logical means in said one-dimensional array to provide access for said particular signal nets.

21. A method of integrating a plurality of logical elements to generate a particular complex logical function comprising the steps of:

providing a semiconductor surface of first conductivity type, a portion of said semiconductor surface defining a diffusion area, diffusing into said semiconductor surface a plurality of elongated diffusions of second conductivity type in spaced parallel fashion and extending across one dimension of said diffusion area, adjacent ones of said diffusions defining ground and output diffusions of a logical element and said semiconductor surface intermediate said adjacent diffusions defining the input channel of said logical element, supplying a reference potential and an operating potential along load means to said ground and said output diffusions, respectively, of each of said logical elements, forming an insulating layer on said semiconductor surface and extending at least over said diffusion area, depositing a plurality of gate electrodes on said insulating layer and distributed in registered fashion over portions of said input channels of said logical elements, depositing a plurality of conductive means on said insulating layer and ranging over said diffusion area in non-ordered fashion for interconnecting gate electrodes of selected logical elements to the output diffusions of other logical elements in accordance with a particular complex logical function, and directing logical input and output signals to gate electrodes and from output diffusions of particular logical elements.

22. The method as defined in claim 21 including the further step of reducing the thickness of portions of said insulating layer whereon said gate electrodes are deposited.

23. The method as defined in claim 21 including the further steps of:

connecting two or more gate electrodes of said selected logical elements along a same conductive means, and aligning said two or more gate electrodes in a direction other than said one dimension of said diffusion area whereby said same conductive means is formed as a straight-line segment.

24. The method as defined in claim 21 including the further step of providing a pattern of access holes in said insulating layer, said access holes being defined over said output diffusions, said conductive means passing through particular access holes to contact the output diffusions of said other logical elements.

25. The method as defined in claim 21 including the further step of depositing gate electrodes of said selected logical elements as interconnected along said conductive means as distinct continuous metallic patterns on said insulating layer.

References Cited

UNITED STATES PATENTS

| | | | |
|---|---|---|---|
| 3,136,897 | 6/1964 | Kaufman | 307—213 |
| 3,139,540 | 6/1964 | Osborne | 307—215 |
| 3,233,123 | 2/1966 | Heiman | 307—205 |
| 3,258,644 | 6/1966 | Rajchman | 315—55 |
| 3,283,170 | 11/1966 | Buie | 307—213 |
| 3,289,093 | 11/1966 | Wanlass | 330—35 |

JAMES D. KALLAM, Primary Examiner

S. BRODER, Assistant Examiner

U.S. Cl. X.R.

307—205; 317—234